United States Patent
Navon et al.

(10) Patent No.: US 9,947,399 B2
(45) Date of Patent: Apr. 17, 2018

(54) UPDATING RESISTIVE MEMORY

(71) Applicant: SANDISK TECHNOLOGIES LLC, Plano, TX (US)

(72) Inventors: Ariel Navon, Revava (IL); Idan Alrod, Herzliya (IL); Eran Sharon, Rishon Lezion (IL); Idan Goldenberg, Ramat Hasharon (IL); Didi Gur, Ofra (IL)

(73) Assignee: SANDISK TECHNOLOGIES LLC, Plano, TX (US)

( * ) Notice: Subject to any disclaimer, the term of this patent is extended or adjusted under 35 U.S.C. 154(b) by 36 days.

(21) Appl. No.: 14/669,731

(22) Filed: Mar. 26, 2015

(65) Prior Publication Data
US 2016/0284403 A1    Sep. 29, 2016

(51) Int. Cl.
G06F 11/10      (2006.01)
G11C 13/00     (2006.01)
G11C 29/52     (2006.01)

(52) U.S. Cl.
CPC ...... *G11C 13/0069* (2013.01); *G06F 11/1056* (2013.01); *G06F 11/1068* (2013.01); *G11C 13/004* (2013.01); *G11C 13/0033* (2013.01); *G11C 13/0097* (2013.01); *G11C 29/52* (2013.01); *G11C 2013/0076* (2013.01); *G11C 2013/0085* (2013.01)

(58) Field of Classification Search
CPC .................................................. G06F 11/1076
USPC ............... 714/764, 768, 719, 758, 16
See application file for complete search history.

(56) References Cited

U.S. PATENT DOCUMENTS

| | | | |
|---|---|---|---|
| 7,397,697 B2 | 7/2008 | So et al. | |
| 7,480,172 B2 * | 1/2009 | Shi | G11C 11/16 365/158 |
| 7,855,923 B2 * | 12/2010 | Li | G11C 8/08 365/148 |
| 8,345,501 B2 * | 1/2013 | Jeong | G11C 7/20 365/200 |
| 8,754,671 B2 * | 6/2014 | Nazarian | H01L 27/101 326/39 |
| 8,780,635 B2 | 7/2014 | Li et al. | |
| 9,191,000 B2 * | 11/2015 | Nazarian | H03K 19/1776 |
| 9,543,012 B2 * | 1/2017 | Harrand | G06F 11/1048 |
| 9,552,896 B2 * | 1/2017 | Oh | G11C 29/52 |
| 2009/0244962 A1 | 10/2009 | Gordon et al. | |
| 2010/0162068 A1 | 6/2010 | Toda | |
| 2010/0246247 A1 | 9/2010 | Kim et al. | |

(Continued)

OTHER PUBLICATIONS

International Search Report and Written Opinion issued on PCT/US2015/061276, dated May 11, 2016.

(Continued)

*Primary Examiner* — Fritz Alphonse
(74) *Attorney, Agent, or Firm* — Foley & Lardner LLP

(57) ABSTRACT

Data is initially programmed in a portion of ReRAM in parallel. Subsequently, one or more ReRAM cells in the portion are determined to contain first data that is to be modified while remaining ReRAM cells in the portion contain second data that is not to be modified. First conditions are applied to the one or more ReRAM cells thereby modifying the first data, while second conditions are applied to the remaining ReRAM cells, the second conditions maintaining the second data in the remaining ReRAM cells without significant change.

23 Claims, 9 Drawing Sheets

(56) References Cited

U.S. PATENT DOCUMENTS

| | | | |
|---|---|---|---|
| 2011/0075484 A1* | 3/2011 | Lee | G11C 16/28 365/185.17 |
| 2011/0185259 A1 | 7/2011 | Seo et al. | |
| 2012/0063196 A1 | 3/2012 | Kim et al. | |
| 2014/0059404 A1 | 2/2014 | Okubo et al. | |
| 2014/0376299 A1* | 12/2014 | Cleveland | G11C 13/0097 365/148 |

OTHER PUBLICATIONS

International Search Report and Written Opinion dated May 11, 2016 in International Patent Application No. PCT/US2015/061276, filed Nov. 18, 2016.

\* cited by examiner

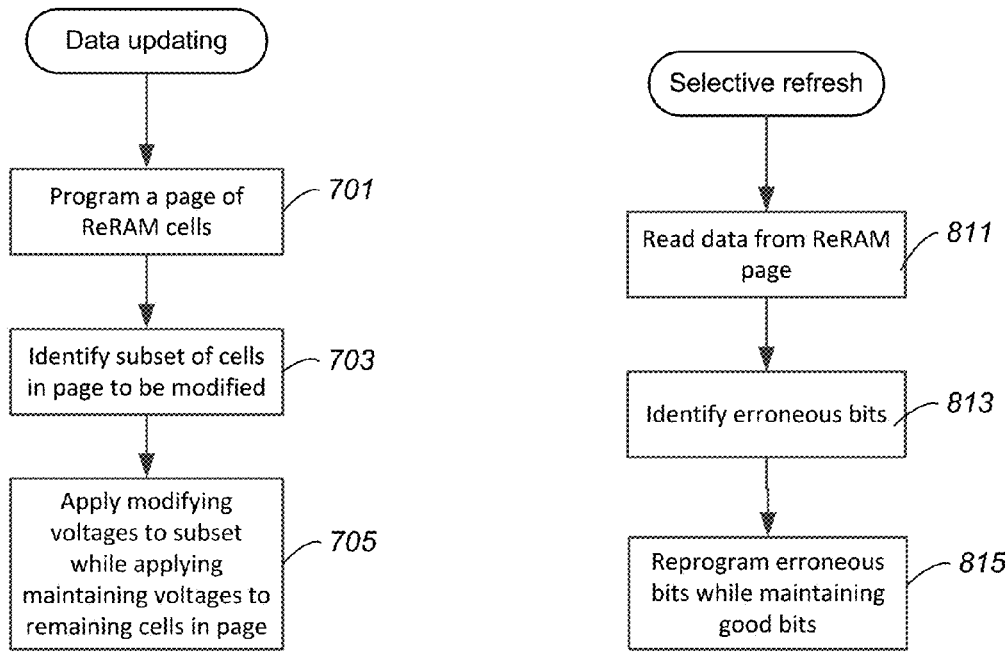
FIG. 7
FIG. 8
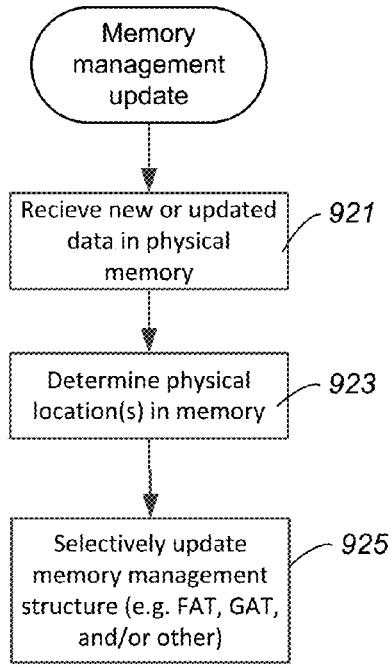
FIG. 9

UPDATING RESISTIVE MEMORY

BACKGROUND

This application relates to the operation of re-programmable nonvolatile memory such as resistive memory including Resistive Random Access Memory (ReRAM).

Re-programmable non-volatile mass data storage systems are widely used for storing data of computer files, camera pictures, and data generated by and/or used by other types of hosts. A popular form of nonvolatile memory is in the form of a card that is removably connected to the host through a connector. There are many different flash memory cards that are commercially available, examples being those sold under trademarks CompactFlash (CF), the MultiMediaCard (MMC), Secure Digital (SD), miniSD, microSD, Memory Stick, Memory Stick Micro, xD-Picture Card, SmartMedia and TransFlash. These cards have unique mechanical plugs and/or electrical interfaces according to their specifications, and plug into mating receptacles provided as part of or connected with the host.

Another form of nonvolatile memory system in widespread use is a USB drive, which is a hand held memory system in a small elongated package that has a Universal Serial Bus (USB) plug for connecting with a host by plugging it into the host's USB receptacle. In yet another form of nonvolatile memory system, a large amount of memory is permanently installed within a host system, such as within a notebook computer in place of the usual disk drive mass data storage system. Such a memory may use a large number of nonvolatile memory chips linked by one or more memory busses to form a large memory array in what may be referred to as a Solid State Drive (SSD).

Each of these three forms of mass data storage systems generally includes a memory controller and drivers. There are also some memory only systems that are instead controlled at least in part by software executed by the host to which the memory is connected. Thus, a dedicated memory controller may not be provided. A nonvolatile memory is typically formed on one or more integrated circuit chips and the controller on another circuit chip. But in some memory systems that include a memory controller, especially those embedded within a host, the memory, controller and drivers may be formed on a single integrated circuit chip.

One common form of nonvolatile memory is flash memory, which uses charge stored in memory cells to represent data bits. Flash memory uses a floating (unconnected) conductive gate, in a field effect transistor structure, positioned over a channel region in a semiconductor substrate, between source and drain regions. A control gate is then provided over the floating gate. The threshold voltage characteristic of the transistor is controlled by the amount of charge that is retained on the floating gate. That is, for a given level of charge on the floating gate, there is a corresponding voltage (threshold) to be applied to the control gate before the transistor is turned "on" to permit conduction between its source and drain regions. Instead of using a conductive floating gate, some charge storage memories use a nonconductive charge storage element, such as a portion of a Charge Trapping Layer (CTL). Flash memory such as Flash EEPROM allows entire blocks of memory cells to be erased at the same time.

Another type of re-programmable non-volatile memory cell uses variable resistance memory elements that may be set to either conductive or non-conductive (or low conductive) states (or, alternately, low or high resistance states, respectively), and some additionally to partially conductive states and remain in that state until subsequently re-set to the initial condition. The variable resistance elements are individually connected between two orthogonally extending conductors (typically bit and word lines) where they cross each other in a two-dimensional or three-dimensional array. The state of such an element is typically changed by proper voltages being placed on the intersecting conductors. Since these voltages are necessarily also applied to a large number of other unselected resistive elements because they are connected along the same conductors as the states of selected elements being programmed or read, diodes are commonly connected in series with the variable resistive elements in order to reduce leakage currents that can flow through them. The desire to perform data reading and programming operations with a large number of memory cells in parallel results in reading or programming voltages being applied to a very large number of other memory cells.

SUMMARY

In some ReRAM memory systems two programming modes may be used. A page programming mode may program a page of cells at a time from a reset (erased) state to target states. This provides high speed writing for large portions of user data. A sub-page reprogramming mode allows subsequent selective reprogramming of a subset of cells in a page that was previously programmed. Reprogramming is performed on memory cells that are not necessarily in the reset state (i.e. may be in set or reset states) and leaves other cells in the same page substantially unaffected so that they maintain data as before. By reprogramming selected cells in-place the power used may be reduced and memory management may be simplified, e.g. operations may be shorter and more efficient and a small number of memory management bits may be selectively updated instead of programming an entire page. Sub-page reprogramming may be used where a portion of user data that is less than a page is to be updated. Sub-page reprogramming may be used to update memory management structures such as tables when a relatively small portion of the structure is updated (e.g. a small number of entries in a FAT or other table). Sub-page reprogramming may update parity data when at least a portion of a corresponding code word is updated.

An example of a method of operating a Resistive Random Access Memory (ReRAM) includes: programming data in ReRAM cells of a portion of the ReRAM in parallel; subsequently, determining that one or more ReRAM cells in the portion of the ReRAM contain first data that is to be modified while remaining ReRAM cells in the portion of the ReRAM contain second data that is not to be modified; applying first conditions to the one or more ReRAM cells in the portion of the ReRAM, the first conditions modifying ReRAM cell states of the one or more ReRAM cells thereby correcting the first data; and while applying the first conditions to the one or more ReRAM cells, applying second conditions to the remaining ReRAM cells in the portion of the ReRAM, the second conditions maintaining the second data in the remaining ReRAM cells of the portion of the ReRAM without significant change.

Determining that one or more ReRAM cells in the portion of the ReRAM contain first data that is to be modified may include reading the portion of the ReRAM and performing Error Correction Code (ECC) decoding of the first and second data to identify that the one or more ReRAM cells contain erroneous bits. Applying the first conditions to the one or more ReRAM cells may include applying at least one of set and/or reset conditions that flip logical states of the one or more ReRAM cells. Determining that the one or more ReRAM cells in the portion of the ReRAM contain first data that is to be modified may include reading the portion of the ReRAM using a high resolution read to identify that the one or more ReRAM cells contain soft errors. Applying the first conditions to the one or more ReRAM cells may include applying at least one of set and/or reset conditions to bring resistances of the one or more ReRAM cells to target resistances corresponding to target logic states. Determining and applying first and second conditions may occur during a refresh operation directed to the portion of the ReRAM. Determining that the one or more ReRAM cells in the portion of the ReRAM contain first data that is to be modified may include identifying an obsolete portion of a memory management structure stored in ReRAM that is to be updated with valid data while other portions of the memory management structure remain valid. The memory management structure may indicate logical-to-physical mapping of data stored in the ReRAM and the valid data may reflect a new physical location for data that was previously stored at an old physical location indicated by the obsolete portion of the memory management structure. Determining that the one or more ReRAM cells in the portion of the ReRAM contain first data that is to be modified may include receiving a host update directed to the first data and not the second data. The first data and the second data may form an ECC code word and new ECC bits may be calculated from modified first data and unmodified second data and old ECC bits may be replaced with the new ECC bits. The ECC code word may consist of a plurality of short code words, the first data consisting of one or more modified short code words of the plurality of short code words and the second data consisting of one or more unmodified short code words of the plurality of short code words. The first data that is to be modified may include ECC parity data bits calculated for a portion of data that is partially changed and partially unchanged, the data modified to reflect parity data bits calculated for a combination of the changed and unchanged data.

An example of a method of refreshing a Resistive Random Access Memory (ReRAM) may include: programming a portion of data in a group of ReRAM cells in parallel; subsequently, reading the portion of data from the group of ReRAM cells; performing Error Correction Code (ECC) decoding of the portion of data to identify erroneous bits in the portion of data from the group of ReRAM cells; applying data changing conditions to first ReRAM cells in the group of ReRAM cells, the first ReRAM cells containing the erroneous bits, the data changing conditions flipping the erroneous bits in the first ReRAM cells; and while applying the data changing conditions to the first ReRAM cells in the group of ReRAM cells, maintaining data in second ReRAM cells in the group of ReRAM cells, the second ReRAM cells containing good bits.

The portion of data may be transferred from a ReRAM die that contains the group of ReRAM cells to a memory controller die; ECC decoding of the portion of data may be performed to identify erroneous bits and good bits in the memory controller die; and identification of the erroneous bits may be transferred back to the ReRAM die without transferring a complete corrected copy of the portion of data back to the ReRAM. The portion of data may be a page of data that contains user data and ECC data. Reading the portion of data may be performed in response to an elapsed time from the programming of the portion of data exceeding a predetermined period. Applying the data changing conditions may include applying voltages to word lines and bit lines that are sufficient to flip cell states of the first ReRAM cells. The voltages applied to word lines and bit lines may not flip cell states of the second ReRAM cells.

An example of a Resistive Random Access Memory (ReRAM) system includes: an array of ReRAM cells; and a programming circuit configured to program data in the array of ReRAM cells in two programming modes: a page programming mode in which a page of ReRAM cells are programmed from an erased condition to programmed states in parallel; and a sub-page reprogramming mode in which fewer than all ReRAM cells of a programmed page of ReRAM cells are selectively reprogrammed to desired states while remaining ReRAM cells of the programmed page remain unchanged.

An Error Correction Code (ECC) circuit may be configured to detect errors in data read from the array of ReRAM cells. The ECC circuit may be configured to perform two ECC encoding schemes, a short code word encoding scheme that encodes one short code word at a time, and a long code word encoding scheme that encodes one long code word at a time, a long code word consisting of a plurality of short code words. The ECC circuit may be configured to recalculate short code ECC bits for a short code word when the short code word is modified, the modified short code word and recalculated short code ECC bits may be programmed in the sub-page reprogramming mode. The ECC circuit may be further configured to recalculate long code ECC bits for a long code word that includes the modified short code word, the recalculated long code ECC bits may be reprogrammed in sub-page reprogramming mode while unmodified short code words in the long code word may remain in a common page with the modified short code word and with the recalculated long code ECC bits. The array of ReRAM cells may be located on a first chip and the ECC circuit may be located on a second chip, the first and second chips connected by a bus. The array of ReRAM cells may be a three dimensional memory array that is monolithically formed in one or more physical levels of arrays of ReRAM cells disposed above a silicon substrate.

Various aspects, advantages, features and embodiments are included in the following description of exemplary examples thereof, which description should be taken in conjunction with the accompanying drawings.

BRIEF DESCRIPTION OF THE DRAWINGS

FIG. 7 illustrates an example of a data updating scheme.

FIG. 8 illustrates an example of a selective refresh scheme.

FIG. 9 illustrates an example of a memory management scheme.

DETAILED DESCRIPTION

Memory System

Figure 1:
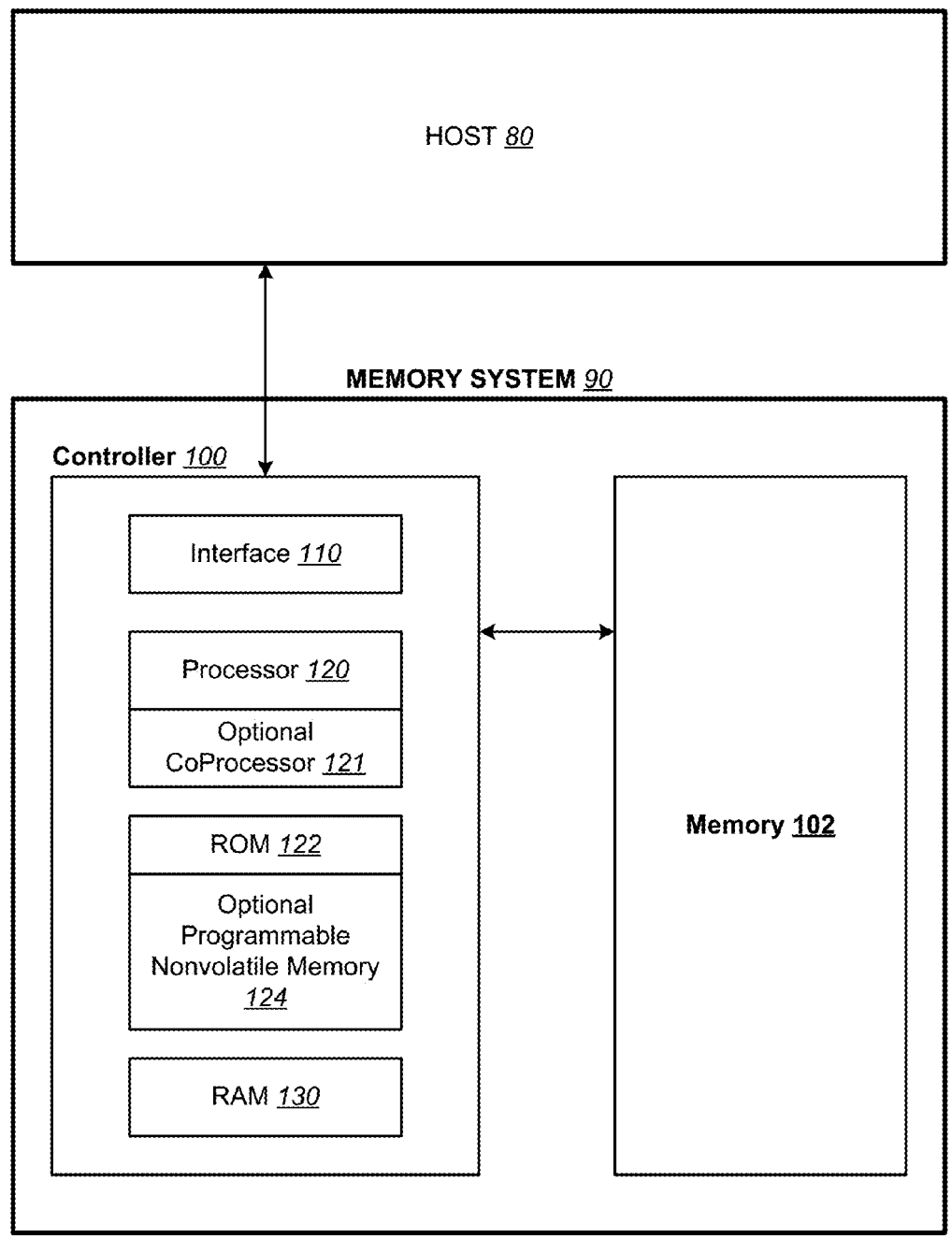
FIG. 1 illustrates schematically the main hardware components of a memory system.

Semiconductor memory devices include volatile memory devices, such as dynamic random access memory ("DRAM") or static random access memory ("SRAM") devices, non-volatile memory devices, such as resistive random access memory ("ReRAM"), electrically erasable programmable read only memory ("EEPROM"), flash memory (which cane also be considered a subset of EEPROM), ferroelectric random access memory ("FRAM"), and magnetoresistive random access memory ("MRAM"), and other semiconductor elements capable of storing information. Each type of memory device may have different configurations. For example, flash memory devices may be configured in a NAND or a NOR configuration.

The memory devices can be formed from passive and/or active elements, in any combinations. By way of non-limiting example, passive semiconductor memory elements include ReRAM device elements, which in some embodiments include a resistivity switching storage element, such as an anti-fuse, phase change material, etc., and optionally a steering element, such as a diode, etc. Further by way of non-limiting example, active semiconductor memory elements include EEPROM and flash memory device elements, which in some embodiments include elements containing a charge storage region, such as a floating gate, conductive nanoparticles, or a charge storage dielectric material.

Multiple memory elements may be configured so that they are connected in series or so that each element is individually accessible. By way of non-limiting example, flash memory devices in a NAND configuration (NAND memory) typically contain memory elements connected in series. A NAND memory array may be configured so that the array is composed of multiple strings of memory in which a string is composed of multiple memory elements sharing a single bit line and accessed as a group. Alternatively, memory elements may be configured so that each element is individually accessible, e.g., a NOR memory array. NAND and NOR memory configurations are exemplary, and memory elements may be otherwise configured.

The semiconductor memory elements located within and/or over a substrate may be arranged in two or three dimensions, such as a two dimensional memory structure or a three dimensional memory structure.

In a two dimensional memory structure, the semiconductor memory elements are arranged in a single plane or a single memory device level. Typically, in a two dimensional memory structure, memory elements are arranged in a plane (e.g., in an x-z direction plane) which extends substantially parallel to a major surface of a substrate that supports the memory elements. The substrate may be a wafer over or in which the layer of the memory elements are formed or it may be a carrier substrate which is attached to the memory elements after they are formed. As a non-limiting example, the substrate may include a semiconductor such as silicon.

The memory elements may be arranged in the single memory device level in an ordered array, such as in a plurality of rows and/or columns. However, the memory elements may be arrayed in non-regular or non-orthogonal configurations. The memory elements may each have two or more electrodes or contact lines, such as bit lines and word lines.

A three dimensional memory array is arranged so that memory elements occupy multiple planes or multiple memory device levels, thereby forming a structure in three dimensions (i.e., in the x, y and z directions, where the y direction is substantially perpendicular and the x and z directions are substantially parallel to the major surface of the substrate).

As a non-limiting example, a three dimensional memory structure may be vertically arranged as a stack of multiple two dimensional memory device levels. As another non-limiting example, a three dimensional memory array may be arranged as multiple vertical columns (e.g., columns extending substantially perpendicular to the major surface of the substrate, i.e., in the y direction) with each column having multiple memory elements in each column. The columns may be arranged in a two dimensional configuration, e.g., in an x-z plane, resulting in a three dimensional arrangement of memory elements with elements on multiple vertically stacked memory planes. Other configurations of memory elements in three dimensions can also constitute a three dimensional memory array.

By way of non-limiting example, in a three dimensional NAND memory array, the memory elements may be coupled together to form a NAND string within a single horizontal (e.g., x-z) memory device levels. Alternatively, the memory elements may be coupled together to form a vertical NAND string that traverses across multiple horizontal memory device levels. Other three dimensional configurations can be envisioned wherein some NAND strings contain memory elements in a single memory level while other strings contain memory elements which span through multiple memory levels. Three dimensional memory arrays may also be designed in a NOR configuration and in a ReRAM configuration.

Typically, in a monolithic three dimensional memory array, one or more memory device levels are formed above a single substrate. Optionally, the monolithic three dimensional memory array may also have one or more memory layers at least partially within the single substrate. As a non-limiting example, the substrate may include a semiconductor such as silicon. In a monolithic three dimensional array, the layers constituting each memory device level of the array are typically formed on the layers of the underlying memory device levels of the array. However, layers of adjacent memory device levels of a monolithic three dimensional memory array may be shared or have intervening layers between memory device levels.

Then again, two dimensional arrays may be formed separately and then packaged together to form a non-monolithic memory device having multiple layers of memory. For example, non-monolithic stacked memories can be constructed by forming memory levels on separate substrates and then stacking the memory levels atop each other. The substrates may be thinned or removed from the memory device levels before stacking, but as the memory device levels are initially formed over separate substrates, the resulting memory arrays are not monolithic three dimensional memory arrays. Further, multiple two dimensional memory arrays or three dimensional memory arrays (monolithic or non-monolithic) may be formed on separate chips and then packaged together to form a stacked-chip memory device.

Associated circuitry is typically required for operation of the memory elements and for communication with the memory elements. As non-limiting examples, memory devices may have circuitry used for controlling and driving memory elements to accomplish functions such as programming and reading. This associated circuitry may be on the same substrate as the memory elements and/or on a separate substrate. For example, a controller for memory read-write operations may be located on a separate controller chip and/or on the same substrate as the memory elements.

In other embodiments, types of memory other than the two dimensional and three dimensional exemplary structures described here may be used.

FIG. 1 illustrates schematically the main hardware components of a memory system suitable for implementing some of the techniques described here. The memory system 90 typically operates with a host 80 through a host interface. The memory system may be in the form of a removable memory such as a memory card, or may be in the form of an embedded memory system, solid state drive, or some other configuration. The memory system 90 includes a memory 102 whose operations are controlled by a controller 100. The memory 102 comprises one or more array of non-volatile memory cells (e.g. flash memory, ReRAM, either planar or 3-D) distributed over one or more integrated circuit chip. The controller 100 may include interface circuits 110, a processor 120, optional coprocessor 121, ROM (read-only-memory) 122, RAM (random access memory) 130, programmable nonvolatile memory 124, and additional components. The controller is typically formed as an ASIC (application specific integrated circuit) and the components included in such an ASIC generally depend on the particular application.

Memory systems may be used with a variety of hosts in a variety of different environments. For example, a host may be a mobile device such as a cell phone, laptop, music player (e.g. MP3 player), Global Positioning System (GPS) device, tablet computer, or the like. Such memory systems may be inactive, without power, for long periods during which they may be subject to various conditions including high temperatures, vibration, electromagnetic fields, etc. Memory systems for such hosts, whether removable or embedded, may be selected for low power consumption, high data retention, and reliability in a wide range of environmental conditions (e.g. a wide temperature range). Other hosts may be stationary. For example, servers used for internet applications may use nonvolatile memory systems for storage of data that is sent and received over the internet. Such systems may remain powered up without interruption for extended periods (e.g. a year or more) and may be frequently accessed throughout such periods. Individual blocks may be frequently written and erased so that endurance may be a major concern.

Physical Memory Structure

Figure 2:
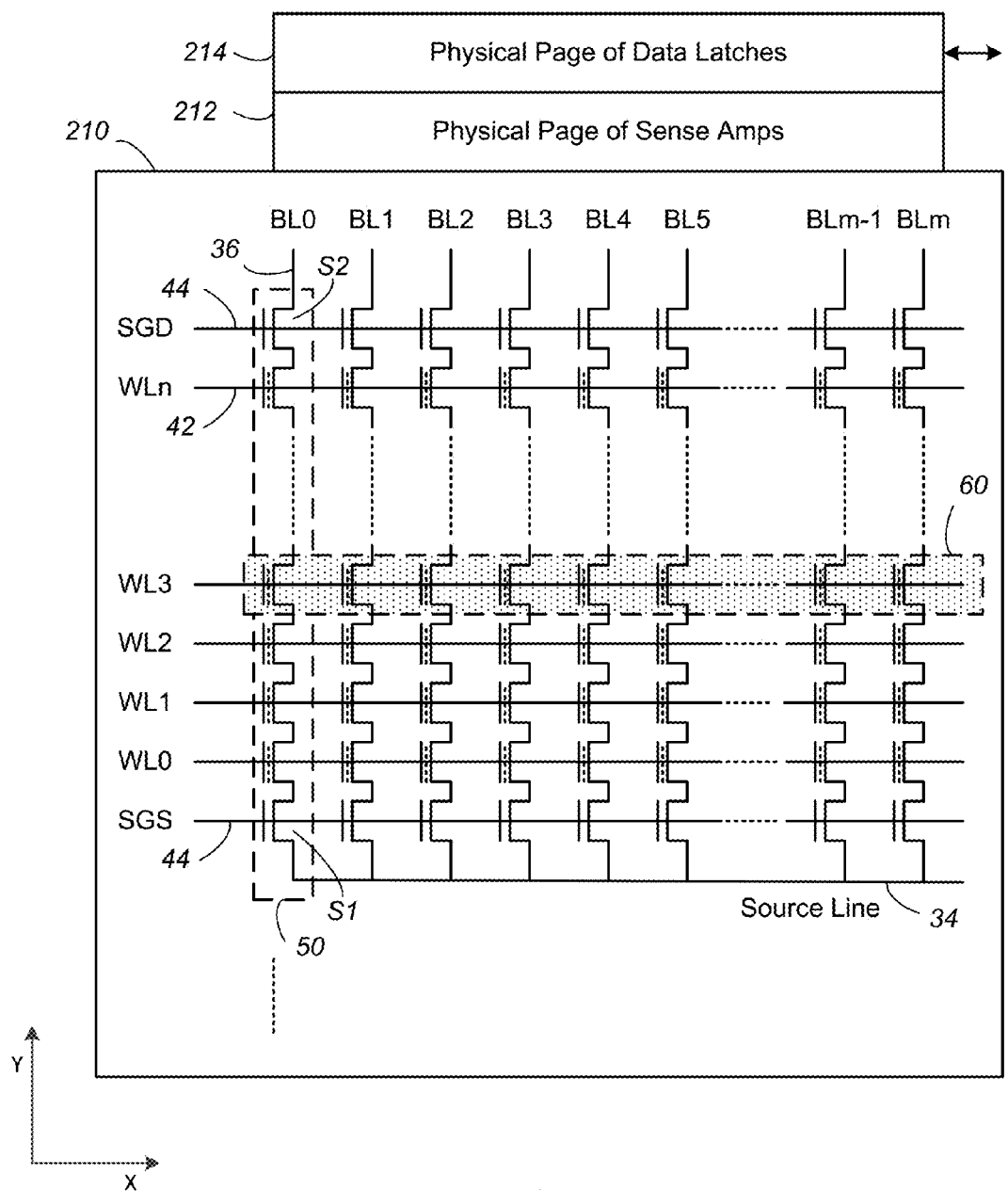
FIG. 2 illustrates a page of memory cells, organized in the NAND configuration, being sensed or programmed in parallel.

FIG. 2 illustrates a page of memory cells, organized in a NAND configuration, being sensed or programmed in parallel. FIG. 2 essentially shows a bank of NAND strings 50 in a memory array 210. A physical page, such as page 60, is a group of memory cells enabled to be sensed or programmed in parallel. This is accomplished by a corresponding page of sense amplifiers 212. The sensed results are latched in a corresponding set of latches 214. Each sense amplifier can be coupled to a NAND string via a bit line. The page is enabled by the control gates of the cells of the page connected in common to a word line 42 and each cell accessible by a sense amplifier accessible via a bit line 36. As an example, when respectively sensing or programming the page of cells 60, a sensing voltage or a programming voltage is respectively applied to the common word line WL3 together with appropriate voltages on the bit lines.

Flash memory cells are generally programmed from the erased state. That is the floating gate is generally first emptied of charge. Programming then adds a desired amount of charge back to the floating gate. Flash memory does not generally support removing a portion of the charge from the floating gate to go from a more programmed state to a lesser one. This means that updated data cannot overwrite existing data and is instead written to a previous unwritten location.

Erasing (removing all charge in memory cells) generally takes appreciable time. For that reason, it would be cumbersome and very slow to erase cell by cell or even page by page. In practice, the array of memory cells is divided into a large number of blocks of memory cells. As is common for flash EEPROM systems, the block is the unit of erase. That is, each block contains the minimum number of memory cells that are erased together. While aggregating a large number of cells in a block to be erased in parallel will improve erase performance, a large size block also entails dealing with a larger number of update and obsolete data.

Each block is typically divided into a number of physical pages. A logical page is a unit of programming or reading that contains a number of bits equal to the number of cells in a physical page. In a memory that stores one bit per cell, one physical page stores one logical page of data. In memories that store two bits per cell, a physical page stores two logical pages. The number of logical pages stored in a physical page thus reflects the number of bits stored per cell. In one embodiment, the individual pages may be divided into segments and the segments may contain the fewest number of cells that are written at one time as a basic programming operation. One or more logical pages of data are typically stored in one row of memory cells. A page can store one or more sectors. A sector includes user data and overhead data.

Some memory systems are based on physical phenomena other than charge storage. An example is Resistive Random Access Memory (ReRAM), which uses electrical resistance of memory elements to store data. High and low resistances may signify different logical states. A window of resistances may be divided into ranges that signify different logical states so that an individual resistive element may store more than one bit. Thus, like charge-storage memory systems, resistive memories, and memories based on other physical phenomena may be used to store one bit per cell in a Single Level Cell (SLC) configuration, or to store multiple bits per cell in a Multi Level Cell (MLC) configuration.

Figure 3:
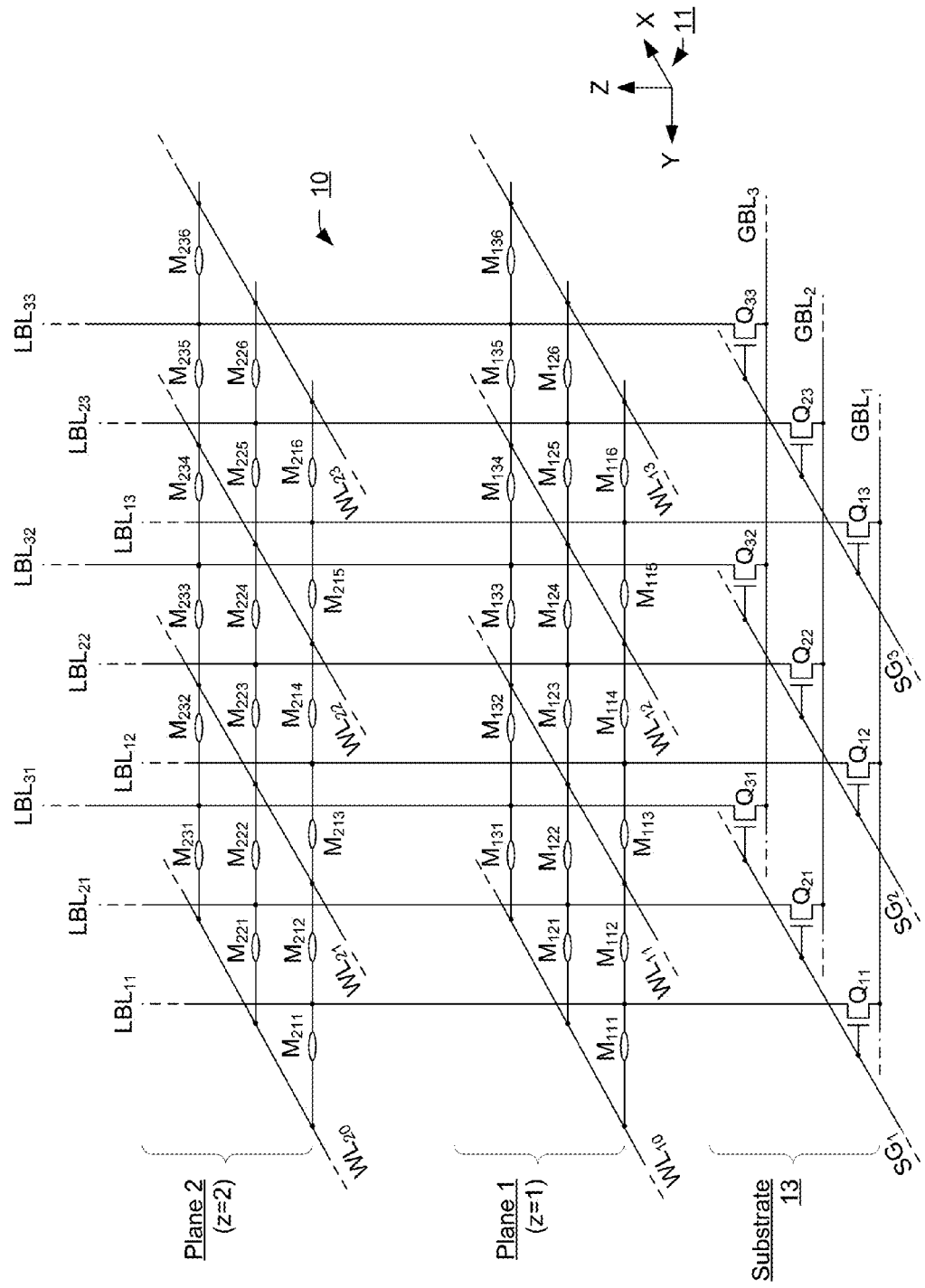
FIG. 3 shows an example of a portion of a ReRAM array.

FIG. 3 shows an example of a three dimensional memory (ReRAM) in which memory elements are formed by resistive elements. Global bit lines (GBL1-GBL3) extend horizontally in the substrate with select transistors connecting global bit lines to local bit lines (LBL11-LBL33). Memory cells are formed in horizontal planes (e.g. plane 1, plane 2) that extend above the substrate. Word lines in each plane connect to resistive elements of the plane with the opposite ends of the resistive elements connected to local bit lines. Word lines extend in pairs in this example (e.g. WL11 and WL12). In other examples word lines connect to resistive elements on either side and are not paired.

A circuit for selectively connecting internal memory elements with external data circuits may be formed in a semiconductor substrate 13. In this specific example, a two-dimensional array of select or switching devices Qxy are utilized, where x gives a relative position of the device in the x-direction and y its relative position in the y-direction. The individual devices Qxy may be a select gate or select transistor, as examples. Global bit lines (GBLx) are elongated in the y-direction and have relative positions in the x-direction that are indicated by the subscript. The global bit lines (GBLx) are individually connectable with the source or drain of the select devices Q having the same position in the x-direction, although during reading and also typically programming only one select device connected with a specific global bit line is turned on at time. The other of the source or drain of the individual select devices Q is connected with one of the local bit lines (LBLxy). The local bit lines are elongated vertically, in the z-direction, and form a regular two-dimensional array in the x (row) and y (column) directions.

In order to connect one set (in this example, designated as one row) of local bit lines with corresponding global bit lines, control gate lines SGy are elongated in the x-direction and connect with control terminals (gates) of a single row of select devices Qxy having a common position in the y-direction. The select devices Qxy therefore connect one row of local bit lines (LBLxy) across the x-direction (having the same position in the y-direction) at a time to corresponding ones of the global bit-lines (GBLx), depending upon which of the control gate lines SGy receives a voltage that turns on the select devices to which it is connected. The remaining control gate lines receive voltages that keep their connected select devices off. It may be noted that since only one select device (Qxy) is used with each of the local bit lines (LBLxy), the pitch of the array across the semiconductor substrate in both x and y-directions may be made very small, and thus the density of the memory storage elements large.

Memory storage elements Mzxy are formed in a plurality of planes positioned at different distances in the z-direction above the substrate 13. Two planes 1 and 2 are illustrated in FIG. 3 but there will typically be more, such as 4, 6 or even more. In each plane at distance z, word lines WLzy are elongated in the x-direction and spaced apart in the y-direction between the local bit-lines (LBLxy). The word lines WLzy of each plane individually cross adjacent two of the local bit-lines LBLxy on either side of the word lines. The individual memory storage elements Mzxy are connected between one local bit line LBLxy and one word line WLzy adjacent these individual crossings. An individual memory element Mzxy is therefore addressable by placing proper voltages on the local bit line LBLxy and word line WLzy between which the memory element is connected. The voltages are chosen to provide the electrical stimulus necessary to cause the state of the memory element to change from an existing state to the desired new state. The levels, duration and other characteristics of these voltages depend upon the material that is used for the memory elements.

Each "plane" of the three-dimensional memory cell structure is typically formed of at least two layers, one in which the conductive word lines WLzy are positioned and another of a dielectric material that electrically isolates the planes from each other. Additional layers may also be present in each plane, depending for example on the structure of the memory elements Mzxy. The planes are stacked on top of each other on a semiconductor substrate with the local bit lines LBLxy being connected with storage elements Mzxy of each plane through which the local bit lines extend.

In the three-dimensional array of FIG. 3, one row of memory elements on one plane may be programmed and read in parallel. The number of memory elements operated in parallel depends on the number of memory elements connected to the selected word line. In some arrays, the word lines may be segmented (not shown in FIG. 3) so that only a portion of the total number of memory elements connected along their length may be addressed for parallel operation, namely the memory elements connected to a selected one of the segments.

Memory elements may be grouped into blocks, where the memory elements of each block may be simultaneously reset to a common state, preferably one of the programmed states, in preparation for subsequently programming them. If the memory element material being used is characterized by changing from a first to a second state in significantly less time than it takes to be changed from the second state back to the first state, then the reset operation may be chosen to cause the transition taking the longer time to be made. The programming (or "setting") is then done faster than resetting. The longer reset time is usually not a problem since resetting blocks of memory elements containing nothing but obsolete data is typically accomplished in a high percentage of the cases in the background, therefore not adversely impacting the programming performance of the memory system.

With the use of block re-setting (block erase) of memory elements, a three-dimensional array of variable resistive memory elements may be operated in a manner similar to current flash memory cell arrays. Resetting a block of memory elements to a common state corresponds to erasing a block of flash memory cells to an erased state. The individual blocks of memory elements may be further divided into a plurality of pages of storage elements, wherein the memory elements of a page are programmed and read together. This is like the use of pages in flash memories. The memory elements of an individual page are programmed and read together. Of course, when programming, those memory elements that are to store data that are represented by the reset state are not changed from the reset state. Those of the memory elements of a page that need to be changed to another state in order to represent the data being stored in them have their states changed by the programming operation. While block re-setting and page programming may be convenient in many cases, changing cell resistances is not limited to such units as will be discussed further below.

Figure 4:
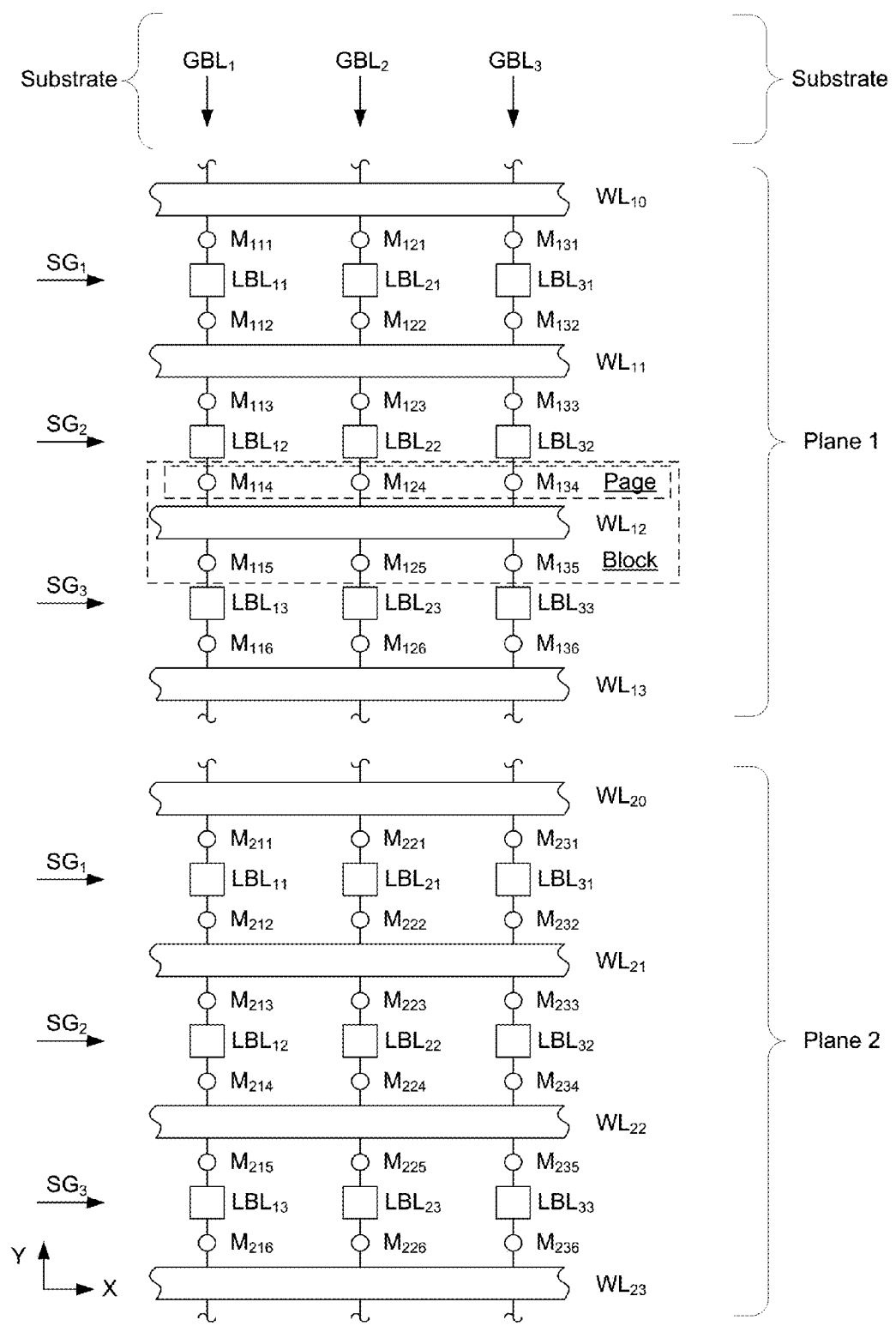
FIG. 4 illustrates an example of block and page structures in ReRAM.

An example of use of such blocks and pages is illustrated in FIG. 4, which provides plan schematic views of planes 1 and 2 of the array of FIG. 3. The different word lines $WL_{zy}$ that extend across each of the planes and the local bit lines $LBL_{xy}$ that extend through the planes are shown in two-dimensions. Individual blocks are made up of memory elements connected to both sides of one word line, or one segment of a word line if the word lines are segmented, in a single one of the planes. There are therefore a very large number of such blocks in each plane of the array. In the block illustrated in FIG. 4, each of the memory elements $M_{114}$, $M_{124}$, $M_{134}$, $M_{115}$, $M_{125}$ and $M_{135}$ connected to both sides of one word line $WL_{12}$ form the block. Of course, there will be many more memory elements connected along the length of a word line but only a few of them are illustrated, for simplicity. The memory elements of each block are connected between the single word line and different ones of the local bit lines, namely, for the block illustrated in FIG. 4, between the word line $WL_{12}$ and respective local bit lines $LBL_{12}$, $LBL_{22}$, $LBL_{32}$, $LBL_{13}$, $LBL_{23}$ and $LBL_{33}$.

A page is also illustrated in FIG. 4. In the specific embodiment being described, there are two pages per block. One page is formed by the memory elements along one side of the word line of the block and the other page by the memory elements along the opposite side of the word line. The example page marked in FIG. 4 is formed by memory elements $M_{114}$, $M_{124}$ and $M_{134}$. Of course, a page will typically have a very large number of memory elements in order to be able to program and read a large amount of data at one time. Only a few of the storage elements of the page of FIG. 4 are included, for simplicity in explanation.

Example resetting, programming (setting) and reading operations of the memory array of FIGS. 3 and 4, will now be described with respect to an SLC memory in which cells have two possible states (High Resistance State "HRS", or reset state, and Low Resistance State "LRS" or set state). In other examples, cells may have three or more states. For these examples, each of the memory elements $M_{zxy}$ is taken to include a non-volatile memory material that can be switched between two stable states of different resistance levels by impressing voltages (or currents) of different polarity across the memory element, or voltages of the same polarity but different magnitudes and/or duration. For example, one class of material may be placed into a high resistance state by passing current in one direction through the element, and into a low resistance state by passing current in the other direction through the element. Or, in the case of switching using the same voltage polarity, one element may need a higher voltage and a shorter time to switch to a high resistance state and a lower voltage and a longer time to switch to a lower resistance state. These are the two memory states of the individual memory elements that indicate storage of one bit of data, which is either a "0" or a "1", depending upon the memory element state. In other examples, more than two memory states may be mapped to more than two logic states so that more than one bit of data may be stored per cell (e.g. four resistance ranges mapped to four logic states representing two bits of data per cell).

To reset (erase) a block of memory elements, the memory elements in that block are placed into their high resistance state (HRS) in this example (other examples may reset, or erase, cells by placing them in their LRS state). This state will be designated as the logical data state "1", following the convention used in current flash memory arrays but it could alternatively be designated to be a "0". As shown by the example in FIG. 4, a block includes all the memory elements that are electrically connected to one word line WL or segment thereof. A block is generally the smallest unit of memory elements in the array that are reset together in a conventional erase operation. It can include thousands of memory elements. If a row of memory elements on one side of a word line includes 1000 of them, for example, a block will have 2000 memory elements from the two rows on either side of the word line.

The following steps may be taken to reset all the memory elements of a block, using the block illustrated in FIG. 4 as an example:

1. Set all of the global bit lines ($GBL_1$, $GBL_2$ and $GBL_3$ in the array of FIGS. 3 and 3) to zero volts, by the sense amplifier and I/O circuits 21 of FIG. 2.

2. Set at least the two select gate lines on either side of the one word line of the block to H' volts, so that the local bit lines on each side of the word line in the y-direction are connected to their respective global bit lines through their select devices and therefore brought to zero volts. The voltage H' is made high enough to turn on the select devices $Q_{xy}$, like something in a range of 1-3 volts, e.g. 2 volts. The block shown in FIG. 4 includes the word line $WL_{12}$, so the select gate lines $SG_2$ and $SG_3$ (FIG. 3) on either side of that word line are set to H' volts, in order to turn on the select devices $Q_{12}$, $Q_{22}$, $Q_{32}$, $Q_{13}$, $Q_{23}$ and $Q_{33}$. This causes each of the local bit lines $LBL_{12}$, $LBL_{22}$, $LBL_{32}$, $LBL_{13}$, $LBL_{23}$ and $LBL_{33}$ in two adjacent rows extending in the x-direction to be connected to respective ones of the global bit lines GBL1, GBL2 and GBL3. Two of the local bit lines adjacent to each other in the y-direction are connected to a single global bit line. Those local bit lines are then set to the zero volts of the global bit lines. The remaining local bit lines preferably remain unconnected and with their voltages floating.

3. Set the word line of the block being reset to H volts. This reset voltage value is dependent on the switching material in the memory element and can be, for example, between a fraction of a volt to a few volts. All other word lines of the array, including the other word lines of selected plane 1 and all the word lines on the other unselected planes, are set to zero volts. In the array of FIGS. 3 and 4, word line $WL_{12}$ is placed at H volts, while all other word lines in the array are placed at zero volts.

The result is that H volts are placed across each of the memory elements of the block. In the example block of FIG. 4, this includes the memory elements $M_{114}$, $M_{124}$, $M_{134}$, $M_{115}$, $M_{125}$ and $M_{135}$. For the type of memory material being used as an example, the resulting currents through these memory elements places any of them not already in a high, resistance state, into that re-set state.

It may also be noted that multiple blocks may be concurrently reset by setting any combination of word lines and the adjacent select gates to H or H' respectively. An increase in the amount of current that may be required to simultaneously reset an increased number of memory elements. This may affect the size of the power supply that is required.

The memory elements of a page may be programmed concurrently, in order to increase the parallelism of the memory system operation. An expanded version of the page indicated in FIG. 4 is provided in FIG. 5, with annotations added to illustrate a programming operation. The individual memory elements of the page are initially in their reset state because all the memory elements of its block have previously been reset. The reset state is taken herein to represent a logical data "1". For any of these memory elements to store a logical data "0" in accordance with incoming data being programmed into the page, those memory elements are switched into their low resistance state (LRS), their set state, while the remaining memory elements of the page remain in the reset state.

For programming a page, only one row of select devices is turned on, resulting in only one row of local bit lines being connected to the global bit lines. This connection alternatively allows the memory elements of both pages of the block to be programmed in two sequential programming cycles, which then makes the number of memory elements in the reset and programming units equal.

Figure 5:
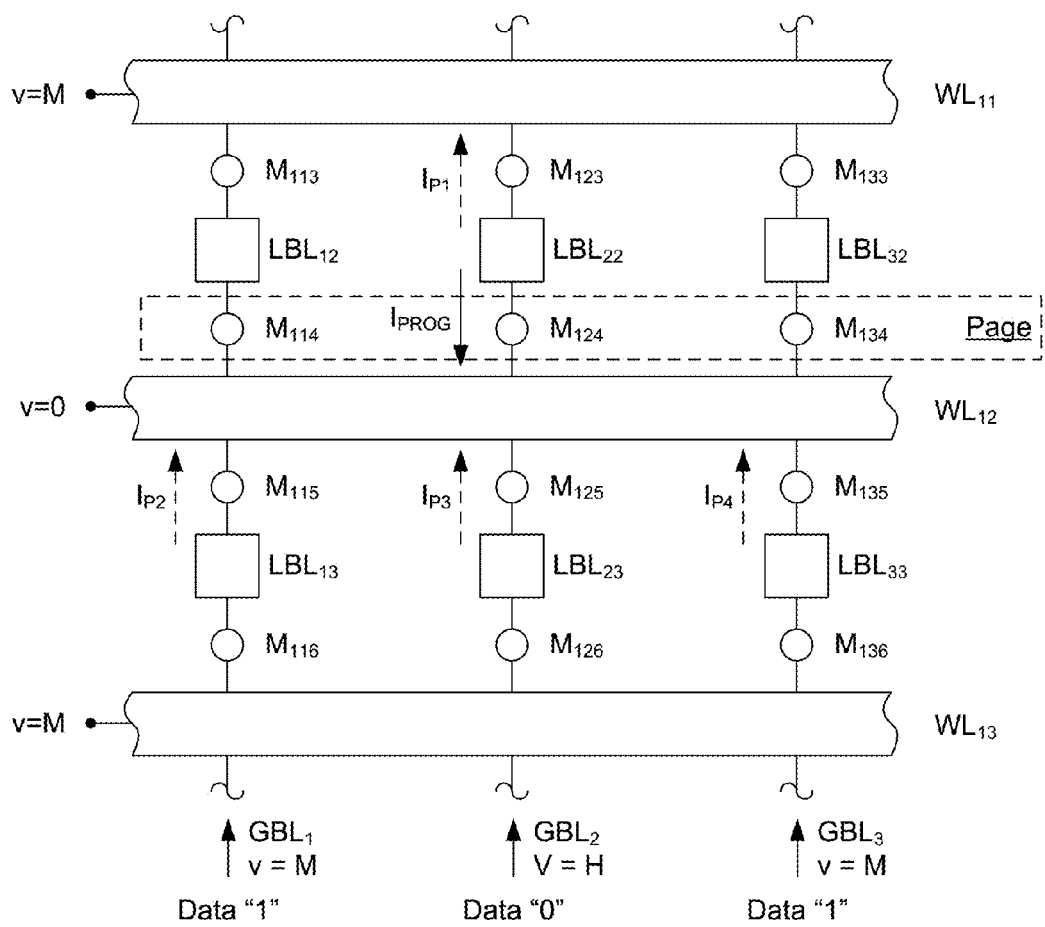
FIG. 5 illustrates an example of programming a page of ReRAM cells.

Referring to FIGS. 4 and 5, an example programming operation within the indicated one page of memory elements $M_{114}$, $M_{124}$ and $M_{134}$ is described, as follows:

1. The voltages placed on the global bit lines are in accordance with the pattern of data received by the memory system for programming. In the example of FIG. 5, $GBL_1$ carries logical data bit "1", $GBL_2$ the logical bit "0" and $GBL_3$ the logical bit "1." The bit lines are set respectively to corresponding voltages M, H and M, as shown, where the M level voltage is high but not sufficient to program a memory element and the H level is high enough to force a memory element into the programmed state. The M level voltage may be about one-half of the H level voltage, between zero volts and H. For example, a M level can be 0.7 volt, and a H level can be 1.5 volt. The H level used for programming is not necessarily the same as the H level used for resetting or reading. In this case, according to the received data, memory elements $M_{114}$ and $M_{134}$ are to remain in their reset state, while memory element $M_{124}$ is being programmed. Therefore, the programming voltages are applied only to memory element $M_{124}$ of this page by the following steps.

2. Set the word line of the page being programmed to 0 volts, in this case selected word line $WL_{12}$. This is the only word line to which the memory elements of the page are connected. Each of the other word lines on all planes is set to the M level.

3. Set one of the select gate lines below and on either side of the selected word line to the H' voltage level, in order to select a page for programming. For the page indicated in FIGS. 3 and 4, the H' voltage is placed on select gate line $SG_2$ in order to turn on select devices $Q_{12}$, $Q_{22}$ and $Q_{32}$ (FIG. 1). All other select gate lines, namely lines $SG_1$ and $SG_3$ in this example, are set to 0 volts in order to keep their select devices off. This connects one row of local bit lines to the global bit lines and leaves all other local bit lines floating. In this example, the row of local bit lines $LBL_{12}$, $LBL_{22}$ and $LBL_{32}$ are connected to the respective global bit lines $GBL_1$, $GBL_2$ and $GBL_3$ through the select devices that are turned on, while all other local bit lines (LBLs) of the array are left floating.

The result of this operation, for the example memory element material mentioned above, is that a programming current $I_{PROG}$ is sent through the memory element $M_{124}$, thereby causing that memory element to change from a reset to a set (programmed) state. The same will occur with other memory elements (not shown) that are connected between the selected word line $WL_{12}$ and a local bit line (LBL) that has the programming voltage level H applied.

An example of the relative timing of applying the above-listed programming voltages is to initially set all the global bit lines (GBLs), the selected select gate line (SG), the selected word line and two adjacent word lines on either side of the selected word line on the one page all to the voltage level M. After this, selected ones of the GBLs are raised to the voltage level H according to the data being programmed while simultaneously dropping the voltage of the selected word line to 0 volts for the duration of the programming cycle. The word lines in plane 1 other than the selected word line $WL_{12}$ and all word lines in the unselected other planes can be weakly driven to M, some lower voltage or allowed to float in order to reduce power that may be delivered by word line drivers.

By floating all the local bit lines other than the selected row (in this example, all but $LBL_{12}$, $LBL_{22}$ and $LBL_{32}$), voltages can be loosely coupled to outer word lines of the selected plane 1 and word lines of other planes that are allowed to float through memory elements in their low resistance state (programmed) that are connected between the floating local bit lines and adjacent word lines. These outer word lines of the selected plane and word lines in unselected planes, although allowed to float, may eventually be driven up to voltage level M through a combination of programmed memory elements.

While the above description assumes that a memory element of the page being programmed will reach its desired ON value with one application of a programming pulse, a program-verify technique commonly used in NOR or NAND flash memory technology may alternately be used. In this process, a complete programming operation for a given page includes of a series of individual programming operations in which a smaller change in ON resistance occurs within each program operation. Interspersed between each program operation is a verify (read) operation that determines whether an individual memory element has reached its desired programmed level of resistance or conductance consistent with the data being programmed in the memory element. The sequence of program/verify is terminated for each memory element as it is verified to reach the desired value of resistance or conductance. After all of memory elements being programmed are verified to have reached their desired programmed value, programming of the page of memory elements is then completed.

Figure 6:
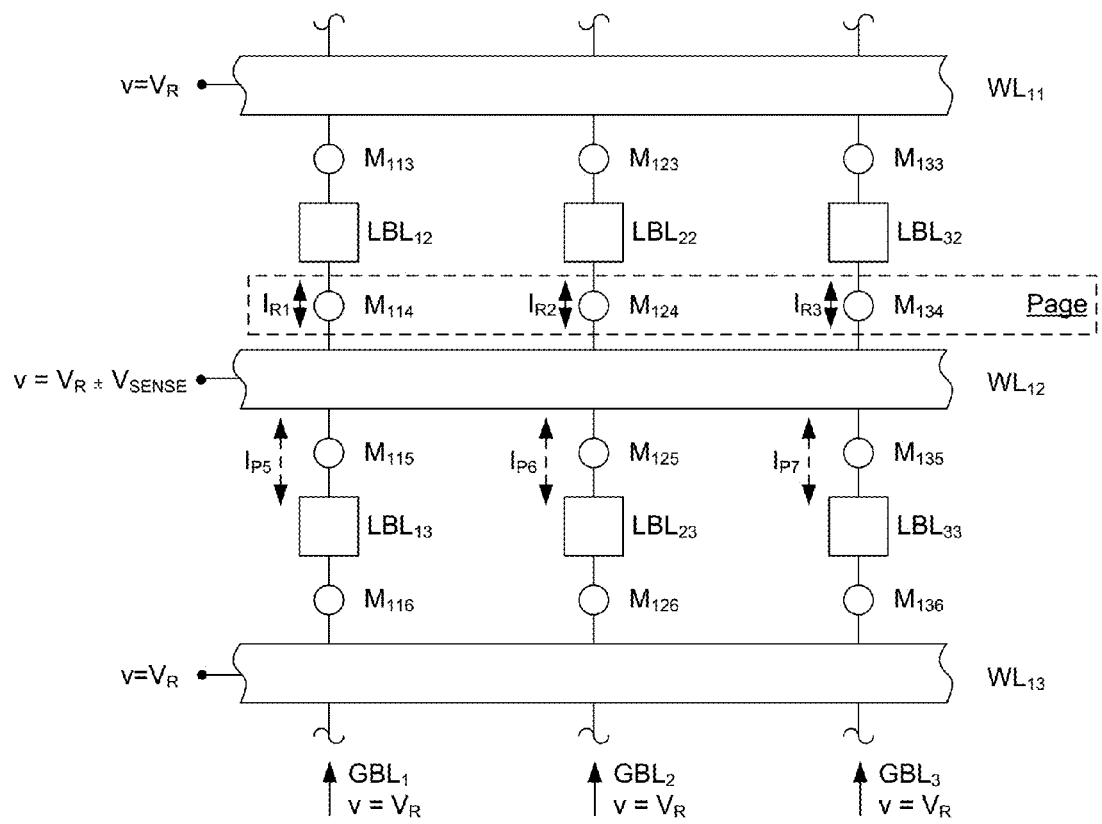
FIG. 6 illustrates an example of reading a page of ReRAM cells.

With reference primarily to FIG. 6, the parallel reading of the states of a page of memory elements, such as the memory elements $M_{114}$, $M_{124}$ and $M_{134}$, is described. The steps of an example reading process are as follows:

1. Set all the global bit lines GBLs and all the word lines WL to a voltage $V_R$. The voltage $V_R$ is simply a convenient reference voltage and can be any number of values but may be between 0 and 1 volt (e.g. between 0.7 and 1 volt). In general, for operating modes where repeated reads occur, it is convenient to set all word lines in the array to $V_R$ in order to reduce parasitic read currents, even though this requires charging all the word lines. However, as an alternative, it is only necessary to raise the selected word line ($WL_{12}$ in FIG. 6), the word line in each of the other planes that is in the same position as the selected word line and the immediately adjacent word lines in all planes to $V_R$.

2. Turn on one row of select devices by placing a voltage on the control line adjacent to the selected word line in order to define the page to be read. In the example of FIG. 6, a voltage is applied to the control line $SG_2$ in order to turn on the select devices $Q_{12}$, $Q_{22}$ and $Q_{32}$. This connects one row of local bit lines $LBL_{12}$, $LBL_{22}$ and $LBL_{32}$ to their respective global bit lines $GBL_1$, $GBL_2$ and $GBL_3$. These local bit lines are then connected to individual sense amplifiers (SA) that are present in sense amplifier and I/O circuits 21 (e.g. peripheral circuits on same die), and assume the potential $V_R$ of the global bit lines to which they are connected. All other local bit lines LBLs are allowed to float.

3. Set the selected word line ($WL_{12}$) to a voltage of $V_R \pm V$sense. The sign of Vsense is chosen based on the sense amplifier and has a magnitude of about 0.5 volt. The voltages on all other word lines remain the same.

4. Sense current flowing into ($V_R$+Vsense) or out of ($V_R$−Vsense) each sense amplifier for time T. These are the currents $I_{R1}$, $I_{R2}$ and $I_{R3}$ shown to be flowing through the addressed memory elements of the example of FIG. 6, which are proportional to the programmed states of the respective memory elements $M_{114}$, $M_{124}$ and $M_{134}$. The states of the memory elements $M_{114}$, $M_{124}$ and $M_{134}$ are then given by binary outputs of the sense amplifiers within the sense amplifier and I/O circuits that are connected to the respective global bit lines $GBL_1$, $GBL_2$ and $GBL_3$. These sense amplifier outputs are then sent to the controller, which then provides the read data to the host.

5. Turn off the select devices ($Q_{12}$, $Q_{22}$ and $Q_{32}$) by removing the voltage from the select gate line ($SG_2$), in order to disconnect the local bit lines from the global bit lines, and return the selected word line ($WL_{12}$) to the voltage $V_R$.

As in the programming case, all of the local bit lines except the selected row ($LBL_{12}$, $LBL_{22}$ and $LBL_{32}$ in the example of FIG. 6) are floating. But the potential of the floating local bit lines may be driven to $V_R$ by any memory element that is in its programmed (low resistance) state and connected between a floating local bit line and a word line at $V_R$, in any plane.

Reference cells may also be included within the memory array 10 to facilitate any or all of the common data operations (erase, program, or read). A reference cell is a cell that is structurally as nearly identical to a data cell as possible in which the resistance is set to a particular value. They are useful to cancel or track resistance drift of data cells associated with temperature, process non-uniformities, repeated programming, time or other cell properties that may vary during operation of the memory. Typically they are set to have a resistance above the highest acceptable low resistance value of a memory element in one data state (such as the ON resistance) and below the lowest acceptable high resistance value of a memory element in another data state (such as the OFF resistance). Reference cells may be "global" to a plane or the entire array, or may be contained within each block or page.

In conventional two-dimensional arrays of variable resistance memory elements, a diode may be included in series with the memory element between the crossing bit and word lines. The primary purpose of the diodes is to reduce the number and magnitudes of parasitic currents during resetting (erasing), programming and reading the memory elements. Diodes may also be connected in series with the individual memory elements of the three-dimensional array, as currently done in other arrays of variable resistive memory elements, in order to reduce further the number of parasitic currents but there are disadvantages in doing so.

Selective Reprogramming

Programming a page of data at a time as shown in FIG. 5 provides high parallelism and high write speeds. Such a programming scheme may allow a stream or burst of data to be rapidly written, for example, when storing video data or a series of still photos in a camera. However, not all data benefits from such high parallelism. For example, in some cases, data that is written in a memory may be updated with a relatively small amount of new or modified data. In many nonvolatile memory systems, for example NAND flash memory systems, such replacement data is generally written in a different block to the original data being updated. The replacement data is then maintained as a valid copy while the replaced data is marked as obsolete. Eventually, valid data may be consolidated and blocks filled with obsolete data may be erased and reused.

An example of a ReRAM system uses two programming schemes, a first programming scheme that programs a page at a time as shown in FIG. 5, and a second reprogramming scheme that modifies a portion of a previously written page while leaving other portions of the previously written page unchanged. Reprogramming may be selective to only those memory elements (cells) that contain bits that are to be modified. Thus, the amount of power consumed in a reprogramming may be significantly less than would be consumed if an entire page was rewritten. Wear on the memory may be reduced because a relatively small number of cells are rewritten. A reprogramming operation does not result in cells containing obsolete data so that the need for housekeeping operations such as consolidation and garbage collection may be reduced or eliminated. Management of data in the memory may be simplified by keeping a given portion of data in a single location where all data remains valid rather than having a portion of data fragmented across different blocks as it is updated, which generally requires complex logical to physical mapping and may result in longer access times.

The program (set) operation of FIG. 5 shows how resistances of cells may be selectively modified from a high resistance state (HRS) to a low resistance state (LRS). While a page of memory cells are programmed together some cells remain in the HRS to record a logic 1 bit while other cells are set to a LRS to record a logic 0. Memory cells connected to a word line that is at 0 volts are set to a LRS if they have H volts on their LBL terminal and remain in a HRS if they have M volts on their LBL terminal. Memory cells may be similarly selectively modified from a LRS to a HRS by selectively applying different voltages to LBL terminals while applying H volts to a particular word line. For example, 0 volts may be applied to LBL terminals of cells to be reset thereby creating a voltage difference of H volts across such cells, while M volts may be applied to LBL terminals of other cells of the same page thereby creating a voltage difference of H-M volts across such cells. While H volts may be sufficient to change a memory cell's resistance, H-M volts may be insufficient so that such cells remain as before and the data in such cells is maintained.

By combining selective program (set) and erase (reset) operations, memory cells may be changed to either increase or decrease resistance as required. Thus, memory cells that are in different states (not all erased) and have different resistances (e.g. HRS and LRS) may be brought to desired states in a selective operation that either increases or decreases their resistances (or leaves them unchanged) as required (i.e. selectively changes cells from HRS to LRS and from LRS to HRS). This allows in-place reprogramming of a number of memory cells that were previously programmed. For example, a page of data may be programmed and subsequently a number of bits in the page may be reprogrammed without affecting the remaining bits in the page.

FIG. 7 illustrates an example of data updating in ReRAM memory. A page of ReRAM cells is programmed 701, for example, during an initial programming operation that stores a file from a host in ReRAM for the first time. Such page-wide programming provides high write speeds. Subsequently, a subset of cells (memory elements) in the page are identified as containing bits that are to be modified 703. For example, a portion of the originally received data that is stored in the page may be updated by the host while remaining data stored in the page is not updated. Rather than writing the new data in a new page (and copying unchanged data to the new location) data is updated in-place, i.e. the data remains in the same cells with some of the bits in the page being flipped. Modifying voltages are applied 705 to the subset of cells while other voltages ("maintaining voltages") are applied to the remaining cells in the page to maintain the data in the cells that contain data that is to remain unchanged. The voltages applied to the subset of cells may include voltages to set certain cells that are in a reset condition (like the set operation of FIG. 5), and voltages to reset cells that are in a set condition (like the reset operation of FIG. 4 with LBL voltages selectively applied). In other examples, ReRAM cells may store two or more bits of data in four or more states, with each state having a corresponding range of resistance. Voltages applied may be such that cells are brought from a resistance range representing a first logic state to a voltage range representing a different logic state. This may involve increasing resistance or decreasing resistance.

In some nonvolatile memory systems, data degrades over time, so that the number of errors in a portion of data may increase as data remains in the memory. Errors may be corrected by Error Correction Code (ECC) correction up to some limit. If the number of errors in a portion of data exceeds such a limit then the data may be Uncorrectable by ECC (UECC). Operations may be performed to maintain data and prevent data from becoming UECC. For example, a refresh operation may read data out of the memory, perform ECC correction on the data, and write the corrected data back to another location in the memory. The old copy is generally marked as obsolete and is subsequently erased when the block containing it contains no valid data. Thus, refresh may include significant resources to write data in new locations and to erase old copies. This may also increase wear on such a memory.

FIG. 8 shows an example of a selective refresh which is performed in-place, i.e. ewriting corrected bits in the same cells that hold the erroneous bits. Data is read from a ReRAM page 811. Subsequently, ECC decoding is used to identify erroneous bits in the data read from the page. Erroneous bits are then reprogrammed 815 by increasing and/or decreasing the resistance of the cells containing erroneous bits. The remaining cells in the page that contain good bits are maintained in their current condition so that they continue to store the same bits. Thus, the page is restored to its original condition with erroneous bits corrected and other bits unaffected. This may provide a faster refresh operation than a full page write to a new location and does not require access to another page. The power used to correct a small number of bits (ECC correctable data generally has a relatively small number of errors as a percentage of total) may be significantly less than would be used for writing a new copy of the entire page.

In some cases, ECC decoding is performed off-chip in an ECC circuit in a memory controller or ASIC. Rather than correcting erroneous bits and returning a corrected copy of the data to a memory die to be written, some identification of erroneous bits may be returned to the memory die so that the erroneous bits may be corrected. Erroneous bits may be identified using a relatively small amount of data compared with a complete copy of the corrected data (i.e. identification of 1-10 erroneous bits in 4 kilobytes may be communicated using much less than 4 kilobytes). Thus, the amount of data sent by the ECC circuit to the memory die may be significantly reduced. This reduces usage of a memory bus between the ECC circuit and memory die.

Erroneous bits may include "bad" bits that are the inverse of the bit that was programmed, i.e. a memory cell that was programmed with logic 0 and is read as logic 1, or programmed with logic 1 and read as logic 0. This may be due to a physical defect that causes the cell to fail, or for some other reason. In other cases, when a memory cell is read it may indicate the correct logic state but a high resolution read may indicate that the condition of the cell is close to a boundary with a different logic state. For example, where two resistance ranges are associated with two logic states, cells may initially be programmed to have distributions that are centered within their respective particular ranges. Over time such distributions may spread so that some cells enter the wrong resistance range (bad bits, or hard errors). Other cells may remain in a resistance range that allows them to be correctly read but may have resistances that are close to the boundary between ranges. Such cells may be considered to contain soft errors and may be subject to modification so that soft errors do not become hard errors. Reprogramming of such cells may include restoring their resistances towards the middle of the appropriate ranges. Thus, an operation may be performed to produce a relatively small change in resistance rather than performing a set or reset operation that would flip a stored bit.

In some memory systems, memory controllers may maintain various memory management structures that are stored in nonvolatile memory. For example, a File Allocation Table (FAT), Group Allocation Table (GAT), directory, bad block list, logical-to-physical map, block health table, and/or other structures may be stored in nonvolatile memory. Such structures may be relatively small and may be updated relatively frequently. Rather than performing a page write each time such a structure is updated, the data may be updated in-place. In some cases, only a small part of such a table is actually modified (i.e. a small number of entries in a table with many entries) so that rewriting only modified bits may significantly reduce the power required and may reduce wear on memory cells.

FIG. 9 shows an example in which new or updated data is received 921 to be written in memory (e.g. ReRAM). The physical location (or locations) where the data is to be written is (are) identified 923. In order to track locations where data is physically stored in the memory a logical-to-physical map may be maintained and the storage of new data may require one or more new or corrected entries in such a map. Rather than rewriting the entire map to a new location, the portion of the file that is updated is selectively updated 925.

In many memory systems, user data is subject to ECC encoding prior to storage and is decoded after being read so that errors can be identified and corrected. ECC encoding may use a block encoding scheme to encode a portion of user data and appending redundant data (e.g. parity bits) to the portion of user data. The portion of user data and appended parity data may be referred to as a "code word." The code word including parity data and user data may then be stored together. When user data is updated, the parity data associated with the old user data generally becomes obsolete. Code words may be of any suitable size and in some cases it is desirable to update less than a full code word stored in memory.

Figure 10A:
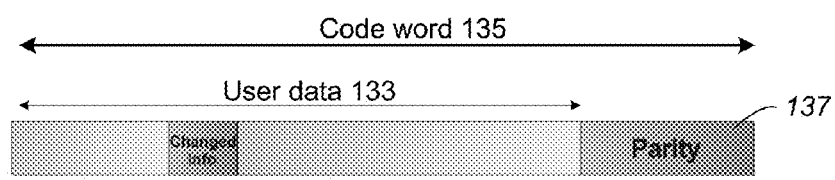
FIGS. 10A-B show examples of ECC encoded data.

FIG. 10A shows an example where a portion of data 131 that is less than the user data 133 of an ECC code word 135. The changed portion 131 may be updated in-place in ReRAM as described above. Parity data 137 may also be recalculated and parity data 137 may be updated in-place. For example, the updated user data may be transferred to an ECC circuit and new parity data may then be calculated and sent to the memory die for sub-page reprogramming in the same location as the old parity data. In some cases, it may be desirable to update parity data in a new location so that wear is not concentrated in the same physical area of the memory. It will be understood that appended parity data is not necessarily physically located as shown (i.e. not necessarily located in a physically contiguous area in memory) and that parity bits may be physically located in cells that are intermingled with cells storing user data.

Figure 10B:
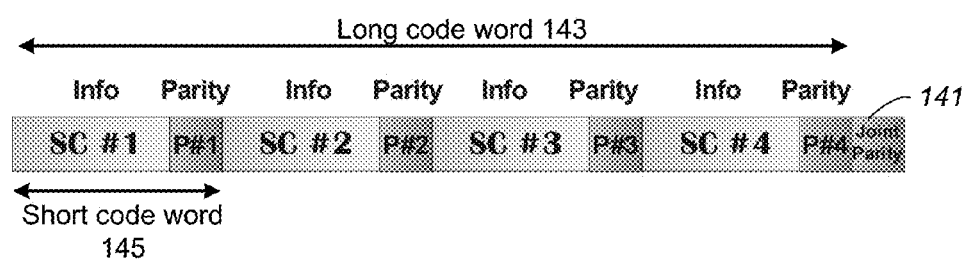

FIG. 10B shows an example in which two different ECC schemes are used. A short code word (SC) scheme encodes short code words. Thus, for example, short code user data SC #1 is encoded to obtain parity P #1, short code user data SC #2 is encoded to obtain parity P #2, and so on. In addition, joint parity data 141 is obtained by calculating parity bits across all four short code words SC #1-4 and P #1-4. Thus, long code word 143 for the long code scheme consists of four short code words (e.g. short code word 145). For example, a long code word may be 4 kilobytes long and may consist of four short code words of 1 kilobyte each. When a short code word is updated (e.g. by modifying a subset of bits in the short code word) its parity data is also updated. In addition, the joint parity data for the long code word that includes the updated short code word is updated. Thus, if SC #1 is updated, not only is P #1 updated, joint parity 141 is also updated. This may be done without affecting SC #2-4 or P #2-4.

Figure 11:
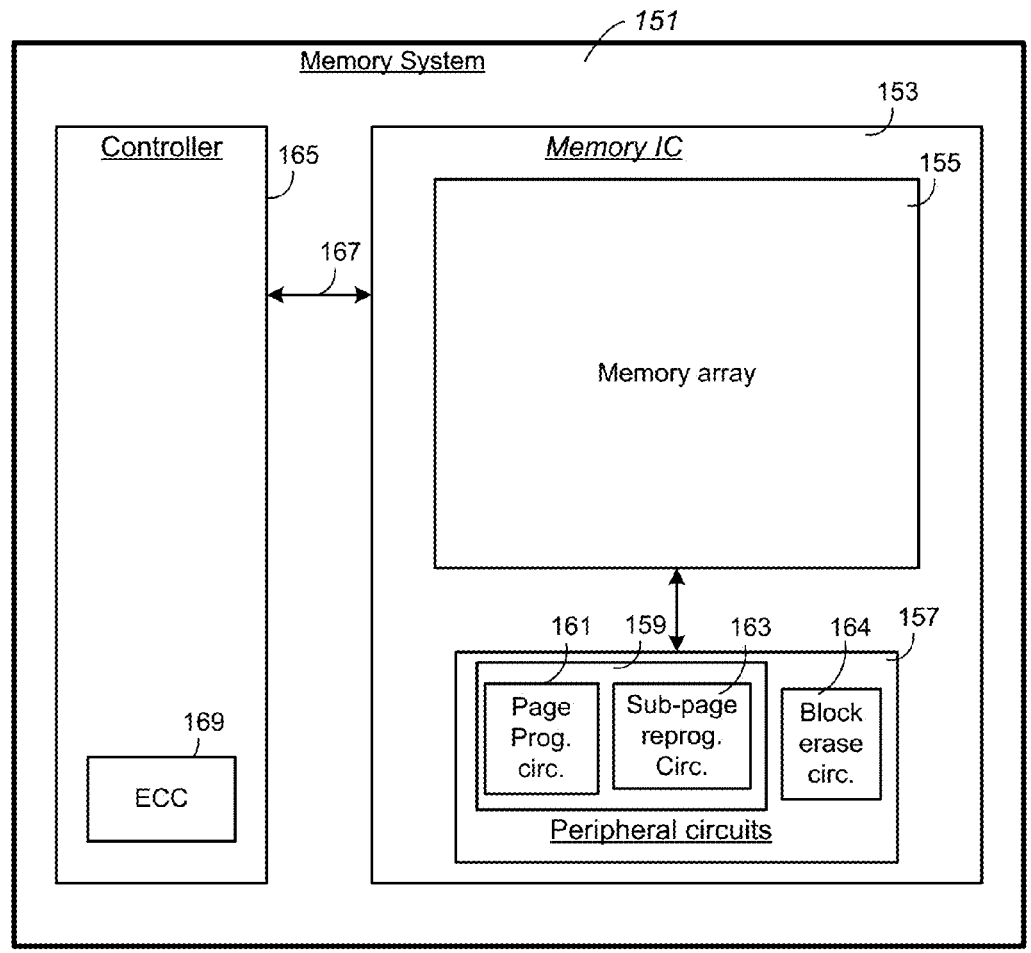
FIG. 11 shows an example of ReRAM memory system hardware.

FIG. 11 shows an example of hardware that may be used to implement aspects of the techniques described above. A memory system 151 includes a memory integrated circuit (IC) 153 which includes a memory array 155 and peripheral circuits 157. The memory array 155 may be a ReRAM memory array. Peripheral circuits 157 include programming circuits 159. Programming circuits 159 include page programming circuits 161 and sub-page reprogramming circuits 163. It will be understood that programming circuit 161 and sub-page reprogramming circuit 163 may share some components and are not necessarily physically separate circuits. Block erase circuit 164 allows a block of memory cells to be erased at a time. Some components may be shared between block erase circuit 164 and sub-page reprogramming circuit 163. A memory controller 165 is formed on a separate die and may be connected to a number of memory dies (not shown) by a memory bus 167. ECC circuits 169 are provided in the memory controller to encode data prior to storage and decode data read from memory IC 153.

CONCLUSION

The foregoing detailed description has been presented for purposes of illustration and description. It is not intended to be exhaustive or to limit the attached claims. Many modifications and variations are possible in light of the above teaching.

It is claimed:

1. An apparatus comprising:
a circuit configured to:
determine that one or more ReRAM cells contain first data that is to be modified while remaining ReRAM cells contain second data that is not to be modified;
apply first conditions to the one or more ReRAM cells, the first conditions configured to modify ReRAM cell states of the one or more ReRAM cells and thereby modify the first data; and
apply, while applying the first conditions to the one or more ReRAM cells, second conditions to the remaining ReRAM cells, the second conditions configured to maintain the second data in the remaining ReRAM cells without significant change,
wherein first conditions are applied to the one or more ReRAM cells by applying voltages to word lines and bit lines that are sufficient to flip cell states of the one or more ReRAM cells.

2. The apparatus of claim 1 wherein the circuit determines that the one or more ReRAM cells contain the first data that is to be modified by reading the one or more ReRAM cells and performing Error Correction Code (ECC) decoding of the first data and the second data to identify that the one or more ReRAM cells contain erroneous bits.

3. The apparatus of claim 2 wherein the circuit applies the first conditions to the one or more ReRAM cells by applying at least one of set and/or reset conditions that flip logical states of the one or more ReRAM cells.

4. The apparatus of claim 1, wherein the circuit determines that the one or more ReRAM cells contain the first data that is to be modified by reading the portion of the ReRAM using a high resolution read to identify that the one or more ReRAM cells contain soft errors.

5. The apparatus of claim 1, wherein the circuit applies the first conditions to the one or more ReRAM cells by applying at least one of set and/or reset conditions to bring resistances of the one or more ReRAM cells to target resistances corresponding to target logic states.

6. The apparatus of claim 1 wherein the circuit determines and applies the first and second conditions during a refresh operation directed to the portion of a ReRAM.

7. The apparatus of claim 1 wherein the circuit determines that the one or more ReRAM cells contain the first data that is to be modified by identifying an obsolete portion of a memory management structure stored in the ReRAM that is to be updated with valid data while other portions of the memory management structure remain valid.

8. The apparatus of claim 7 wherein the memory management structure indicates logical-to-physical mapping of data stored in the ReRAM and the valid data reflects a new physical location for data that was previously stored at an old physical location indicated by the obsolete portion of the memory management structure.

9. The apparatus of claim 1 wherein the circuit determines that the one or more ReRAM cells in the portion of the ReRAM contain first data that is to be modified by receiving a host update directed to the first data and not the second data.

10. The apparatus of claim 9 wherein the first data and the second data form an ECC code word and wherein the circuit is further configured to calculate new ECC bits from modified first data and unmodified second data and replace old ECC bits with the new ECC bits.

11. The apparatus of claim 10 wherein the ECC code word consists of a plurality of short code words, the first data consisting of one or more modified short code words of the plurality of short code words and the second data consisting of one or more unmodified short code words of the plurality of short code words.

12. The apparatus of claim 1 wherein the first data that is to be modified includes ECC parity data bits calculated for a portion of data that is partially changed and partially unchanged, the data modified to reflect parity data bits calculated for a combination of the changed and unchanged data.

13. A method of refreshing a Resistive Random Access Memory (ReRAM) comprising:
programming, by a programming circuit, a portion of data in a group of ReRAM cells in parallel;
subsequently, reading, by the programming circuit, the portion of data from the group of ReRAM cells;
performing Error Correction Code (ECC) decoding, by an error correction code circuit, of the portion of data to identify erroneous bits in the portion of data from the group of ReRAM cells;
applying data changing conditions, by the error correction code circuit, to first ReRAM cells in the group of ReRAM cells, the first ReRAM cells containing the erroneous bits, the data changing conditions flipping the erroneous bits in the first ReRAM cells; and
while applying the data changing conditions to the first ReRAM cells in the group of ReRAM cells, maintaining, by the error correction code circuit, data in second ReRAM cells in the group of ReRAM cells, the second ReRAM cells containing good bits,
wherein applying the data changing conditions includes applying voltages to word lines and bit lines that are sufficient to flip cell states of the first ReRAM cells.

14. The method of claim 13 further comprising:
transferring the portion of data from a ReRAM die that contains the group of ReRAM cells to a memory controller die;
performing the ECC decoding of the portion of data to identify erroneous bits and good bits in the memory controller die; and
transferring identification of the erroneous bits back to the ReRAM die without transferring a complete corrected copy of the portion of data back to the ReRAM.

15. The method of claim 13 wherein the portion of data is a page of data that contains user data and ECC data.

16. The method of claim 13 wherein the reading the portion of data is performed in response to an elapsed time from the programming of the portion of data exceeding a predetermined period.

17. The method of claim 13 wherein the voltages applied to word lines and bit lines do not flip cell states of the second ReRAM cells.

18. A Resistive Random Access Memory (ReRAM) system comprising:
- an array of ReRAM cells;
- a programming circuit configured to program data in the array of ReRAM cells in two programming modes:
  - (a) a page programming mode in which a page of ReRAM cells are programmed from an erased condition to programmed states in parallel; and
  - (b) a sub-page reprogramming mode in which fewer than all ReRAM cells of a programmed page of ReRAM cells are selectively reprogrammed to desired states while remaining ReRAM cells of the programmed page remain unchanged; and
- an Error Correction Code (ECC) circuit that is configured to detect errors in data read from the array of ReRAM cells.

19. The ReRAM system of claim 18 wherein the ECC circuit is configured to perform two ECC encoding schemes, a short code word encoding scheme that encodes one short code word at a time, and a long code word encoding scheme that encodes one long code word at a time, a long code word consisting of a plurality of short code words.

20. The ReRAM system of claim 19 wherein the ECC circuit is configured to recalculate short code ECC bits for a short code word when the short code word is modified, the modified short code word and recalculated short code ECC bits programmed in the sub-page reprogramming mode.

21. The ReRAM system of claim 20 wherein the ECC circuit is further configured to recalculate long code ECC bits for a long code word that includes the modified short code word, the recalculated long code ECC bits reprogrammed in sub-page reprogramming mode while unmodified short code words in the long code word remain in a common page with the modified short code word and with the recalculated long code ECC bits.

22. The ReRAM system of claim 18 wherein the array of ReRAM cells is located on a first chip and the ECC circuit is located on a second chip, the first and second chips connected by a bus.

23. The ReRAM system of claim 18 wherein the array of ReRAM cells is a three dimensional memory array that is monolithically formed in one or more physical levels of arrays of ReRAM cells disposed above a silicon substrate.

* * * * *